(12) United States Patent
Wang et al.

(10) Patent No.: US 11,488,812 B2
(45) Date of Patent: Nov. 1, 2022

(54) METHOD AND APPARATUS FOR REDUCING PARTICLE DEFECTS IN PLASMA ETCH CHAMBERS

(71) Applicant: Applied Materials, Inc., Santa Clara, CA (US)

(72) Inventors: Xikun Wang, Sunnyvale, CA (US); Andrew Nguyen, San Jose, CA (US); Changhun Lee, San Jose, CA (US); Xiaoming He, Arcadia, CA (US); Meihua Shen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/438,277

(22) Filed: Jun. 11, 2019

(65) Prior Publication Data
US 2019/0295826 A1  Sep. 26, 2019

Related U.S. Application Data

(62) Division of application No. 13/174,090, filed on Jun. 30, 2011, now Pat. No. 10,658,161.
(Continued)

(51) Int. Cl.
*H01J 37/32*  (2006.01)

(52) U.S. Cl.
CPC .... *H01J 37/32862* (2013.01); *H01J 37/3244* (2013.01)

(58) Field of Classification Search
CPC .............. C23C 16/402; C23C 16/4404; C23C 16/4405; C23C 16/45542;
(Continued)

(56) References Cited

U.S. PATENT DOCUMENTS 1,968,348 A * 7/1934 Placide ..................... B05B 1/02
                                                        239/590.5
2,933,259 A * 4/1960 Raskin ..................... B05B 7/12
                                                        239/405
(Continued)

FOREIGN PATENT DOCUMENTS

CN  1365138  8/2002
CN  1507502  6/2004
(Continued)

OTHER PUBLICATIONS

Search Report for Taiwan Invention Patent Application No. 100137411; filed Oct. 14, 2011; 1 page.

(Continued)

*Primary Examiner* — Rudy Zervigon
(74) *Attorney, Agent, or Firm* — Schwabe, Williamson & Wyatt, P.C.

(57) ABSTRACT

In-situ low pressure chamber cleans and gas nozzle apparatus for plasma processing systems employing in-situ deposited chamber coatings. Certain chamber clean embodiments for conductor etch applications include an $NF_3$-based plasma clean performed at pressures below 30 mT to remove in-situ deposited $SiO_x$ coatings from interior surfaces of a gas nozzle hole. Embodiments include a gas nozzle with bottom holes dimensioned sufficiently small to reduce or prevent the in-situ deposited chamber coatings from building up a $SiO_x$ deposits on interior surfaces of a nozzle hole.

9 Claims, 7 Drawing Sheets

Related U.S. Application Data

(60) Provisional application No. 61/413,315, filed on Nov. 12, 2010, provisional application No. 61/393,729, filed on Oct. 15, 2010.

(58) Field of Classification Search
CPC ........ C23C 16/45563; C23C 16/45565; C23C 16/45568; C23C 16/45574; C23C 16/52; H01J 37/32009; H01J 37/32082; H01J 37/32091; H01J 37/321; H01J 37/32412; H01J 37/3244; H01J 37/32449; H01J 37/32798; H01J 37/32862; H01J 2237/334; H01L 21/02274; H01L 21/0228; H01L 21/3065; H01L 21/31116; H01L 21/32137; H01L 21/67069; C23F 4/00; Y10S 134/902; Y10S 438/905; Y10S 438/906
USPC .................. 118/715; 156/345.33, 345.34
See application file for complete search history.

(56) References Cited

U.S. PATENT DOCUMENTS

| | | | | |
|---|---|---|---|---|
| 3,352,492 A * | 11/1967 | Cape | ................ | B05B 7/1413 239/85 |
| 3,995,811 A * | 12/1976 | Broderick | ............... | B05B 7/206 239/85 |
| 4,439,401 A * | 3/1984 | Voll | ........................ | C09C 1/50 422/150 |
| 4,540,466 A * | 9/1985 | Nishizawa | ............ | C23C 16/482 118/50.1 |
| 4,854,263 A * | 8/1989 | Chang | ................... | C23C 16/345 118/715 |
| 4,886,571 A * | 12/1989 | Suzuki | .................... | C23C 16/44 216/79 |
| 4,901,667 A * | 2/1990 | Suzuki | .................. | C23C 16/452 118/715 |
| 5,105,761 A * | 4/1992 | Charlet | .............. | H01J 37/3244 118/719 |
| 5,108,543 A * | 4/1992 | Suzuki | .................... | C23C 14/22 117/103 |
| 5,108,778 A * | 4/1992 | Suzuki | .................... | C23C 16/48 216/63 |
| 5,147,199 A * | 9/1992 | Perthuis | ................. | F23C 6/047 431/10 |
| 5,188,671 A * | 2/1993 | Zinck | ................... | C30B 23/06 118/715 |
| 5,284,519 A * | 2/1994 | Gadgil | ................. | C23C 16/455 118/715 |
| 5,350,480 A * | 9/1994 | Gray | ................. | H01L 21/02071 134/31 |
| 5,372,674 A * | 12/1994 | Steinberg | .......... | H01J 37/32009 216/17 |
| 5,421,888 A * | 6/1995 | Hasegawa | ............ | C23C 16/045 118/715 |
| 5,542,559 A * | 8/1996 | Kawakami | .......... | H01L 21/6838 216/67 |
| 5,547,642 A * | 8/1996 | Seiwa | .................... | C01B 13/00 118/723 R |
| 5,734,143 A * | 3/1998 | Kawase | ............. | H01J 37/32229 219/121.43 |
| 5,783,023 A * | 7/1998 | Oh | ...................... | H01J 37/3244 156/345.34 |
| 6,083,344 A * | 7/2000 | Hanawa | ............ | H01J 37/32174 156/345.28 |
| 6,172,401 B1 | 1/2001 | Brand | | |
| 6,274,933 B1 | 8/2001 | Abdelgadir et al. | | |
| 6,299,692 B1 * | 10/2001 | Ku | ..................... | C23C 16/4485 392/397 |
| 6,302,960 B1 * | 10/2001 | Baroudi | ................. | B05C 11/08 118/320 |
| 6,303,466 B1 * | 10/2001 | Shimonishi | ........ | H01L 21/76232 257/E21.549 |
| 6,334,983 B1 * | 1/2002 | Okayama | ............... | C23C 16/455 156/345.34 |
| 6,433,298 B1 * | 8/2002 | Ishii | .................. | H01J 37/32192 118/723 MW |
| 6,471,779 B1 * | 10/2002 | Nishio | .................. | C23C 16/455 118/715 |
| 6,565,661 B1 * | 5/2003 | Nguyen | ............ | C23C 16/45565 118/715 |
| 7,025,831 B1 * | 4/2006 | Butterbaugh | ........... | C03C 15/00 118/715 |
| RE39,939 E * | 12/2007 | Okayama | ............... | C23C 16/455 156/345.34 |
| RE39,969 E * | 1/2008 | Okayama | ............... | C23C 16/455 156/345.34 |
| RE40,046 E * | 2/2008 | Okayama | ............... | C23C 16/455 156/345.34 |
| 7,902,078 B2 | 3/2011 | Nakaya | | |
| 8,343,371 B2 * | 1/2013 | Funk | ................. | H01J 37/32009 216/59 |
| 8,372,200 B2 * | 2/2013 | Okesaku | ................ | C23C 16/24 438/488 |
| 8,419,859 B2 * | 4/2013 | Fukiage | ............... | C23C 16/4405 134/1.1 |
| 2001/0010257 A1 * | 8/2001 | Ni | ....................... | H01J 37/3244 156/345.33 |
| 2001/0035127 A1 * | 11/2001 | Metzner | ............... | C23C 16/407 118/715 |
| 2002/0028567 A1 * | 3/2002 | Aruga | ................. | C23C 16/401 438/488 |
| 2002/0050323 A1 * | 5/2002 | Moisan | .................... | H05H 1/30 156/345.41 |
| 2002/0086106 A1 * | 7/2002 | Park | .................. | C23C 16/45563 427/248.1 |
| 2002/0088545 A1 * | 7/2002 | Lee | ................... | C23C 16/45565 156/345.33 |
| 2002/0139665 A1 * | 10/2002 | DeOrnellas | ....... | H01J 37/32623 204/298.01 |
| 2002/0160113 A1 * | 10/2002 | Li | ........................ | C23C 16/401 427/255.28 |
| 2002/0187635 A1 * | 12/2002 | Pyo | ................... | H01L 21/67167 438/680 |
| 2002/0195202 A1 * | 12/2002 | Arita | ................. | C23C 16/45568 156/345.33 |
| 2002/0197877 A1 * | 12/2002 | Arita | ................. | H01J 37/3244 438/710 |
| 2003/0000546 A1 * | 1/2003 | Richardson | ....... | H01J 37/32862 134/1.1 |
| 2003/0029475 A1 * | 2/2003 | Hua | ..................... | B08B 7/0035 134/1.1 |
| 2003/0037880 A1 * | 2/2003 | Carducci | ............ | H01J 37/32522 156/345.43 |
| 2003/0038111 A1 * | 2/2003 | Carducci | ............ | H01J 37/32522 216/59 |
| 2003/0066816 A1 * | 4/2003 | Schultz | ..................... | B81C 1/00087 216/41 |
| 2003/0070620 A1 * | 4/2003 | Cooperberg | .......... | H01J 37/321 118/723 AN |
| 2003/0098039 A1 * | 5/2003 | Cheong | ................ | C23C 16/4404 156/345.33 |
| 2003/0140851 A1 * | 7/2003 | Janakiraman | ......... | C23C 16/455 118/715 |
| 2003/0173333 A1 * | 9/2003 | Wang | .................... | H01J 37/321 216/67 |
| 2003/0183244 A1 * | 10/2003 | Rossman | ............... | B08B 7/0035 134/1.1 |
| 2003/0192645 A1 * | 10/2003 | Liu | ................... | H01L 21/67017 156/345.33 |
| 2004/0011286 A1 * | 1/2004 | Kwon | .................... | C23C 16/455 156/345.34 |
| 2004/0129217 A1 * | 7/2004 | Strang | ................ | H01J 37/3244 118/715 |
| 2004/0163761 A1 * | 8/2004 | Strang | ................ | H01J 37/3244 156/345.33 |

(56) References Cited

U.S. PATENT DOCUMENTS

| | | | |
|---|---|---|---|
| 2004/0166597 A1* | 8/2004 | Strang | H01J 37/3244 438/5 |
| 2004/0168769 A1* | 9/2004 | Matsuoka | C23C 16/511 156/345.33 |
| 2004/0173159 A1* | 9/2004 | Kuthi | H01J 37/32009 118/723 E |
| 2004/0217217 A1* | 11/2004 | Han | C23C 16/4558 239/589 |
| 2005/0000423 A1* | 1/2005 | Kasai | C23C 16/45565 118/715 |
| 2005/0092245 A1* | 5/2005 | Moon | H01J 37/3244 118/715 |
| 2005/0092935 A1* | 5/2005 | Demos | H01J 3/025 250/492.2 |
| 2005/0109460 A1* | 5/2005 | deDontney | C23C 16/45574 156/345.33 |
| 2005/0118296 A1* | 6/2005 | Kaneko | C23C 16/4405 134/1.1 |
| 2005/0160982 A1* | 7/2005 | Ha | C23C 16/45578 118/715 |
| 2005/0178748 A1* | 8/2005 | Buchberger | H01J 37/32082 219/121.48 |
| 2005/0183666 A1* | 8/2005 | Tsuji | C23C 16/345 118/723 E |
| 2005/0199184 A1* | 9/2005 | Murugesh | C23C 16/4405 118/715 |
| 2005/0205110 A1* | 9/2005 | Kao | H01J 37/32082 134/1.1 |
| 2005/0241765 A1* | 11/2005 | Dhindsa | H01J 37/32009 156/345.34 |
| 2006/0000395 A1* | 1/2006 | Joshi | F23D 14/22 110/267 |
| 2006/0096540 A1* | 5/2006 | Choi | C23C 16/45578 118/724 |
| 2006/0130756 A1* | 6/2006 | Liang | C23C 16/45563 118/715 |
| 2006/0130873 A1* | 6/2006 | Richardson | H01J 37/32963 134/1.1 |
| 2006/0196420 A1* | 9/2006 | Ushakov | H01J 37/3244 118/715 |
| 2006/0196603 A1* | 9/2006 | Lei | H01J 37/32449 156/345.33 |
| 2006/0219362 A1* | 10/2006 | Han | C23C 16/45565 156/345.33 |
| 2007/0144671 A1* | 6/2007 | Ohmi | H01J 37/3244 156/345.34 |
| 2007/0145021 A1* | 6/2007 | Wang | H01J 37/32449 219/121.43 |
| 2007/0148848 A1* | 6/2007 | Kim | H01L 21/823842 438/199 |
| 2007/0151516 A1* | 7/2007 | Law | C23C 16/45565 118/723 E |
| 2007/0187363 A1* | 8/2007 | Oka | H01J 37/32449 156/345.33 |
| 2007/0197041 A1* | 8/2007 | Nakaya | C23C 16/45519 |
| 2007/0199922 A1* | 8/2007 | Shen | H01J 37/3244 239/548 |
| 2007/0232071 A1* | 10/2007 | Balseanu | H01L 21/31116 438/694 |
| 2007/0256785 A1* | 11/2007 | Pamarthy | H01J 37/3244 156/345.33 |
| 2007/0256786 A1* | 11/2007 | Zhou | H01J 37/32477 156/345.34 |
| 2008/0035170 A1* | 2/2008 | Baek | H01J 37/32862 134/1.1 |
| 2008/0057729 A1 | 3/2008 | Shen et al. | |
| 2008/0095953 A1* | 4/2008 | Lee | C23C 16/45578 427/569 |
| 2008/0102594 A1* | 5/2008 | Kim | H01L 28/91 438/381 |
| 2008/0110400 A1* | 5/2008 | Satou | H01J 37/3244 118/723 VE |
| 2008/0121178 A1* | 5/2008 | Bang | C23C 16/4405 |
| 2008/0141941 A1* | 6/2008 | Augustino | C23C 16/45565 118/723 R |
| 2008/0190893 A1* | 8/2008 | Mori | C23F 4/00 216/61 |
| 2008/0272712 A1* | 11/2008 | Jalink | A61B 18/20 606/14 |
| 2008/0286982 A1* | 11/2008 | Li | H01J 37/32449 438/782 |
| 2009/0000641 A1* | 1/2009 | Bao | B08B 3/08 134/3 |
| 2009/0042321 A1* | 2/2009 | Sasaki | H01J 37/32449 438/10 |
| 2009/0047426 A1* | 2/2009 | Park | C23C 16/45544 427/248.1 |
| 2009/0061083 A1* | 3/2009 | Chiang | C23C 16/45544 427/248.1 |
| 2009/0061644 A1* | 3/2009 | Chiang | C23C 16/45544 438/763 |
| 2009/0120364 A1* | 5/2009 | Suarez | C23C 16/45512 118/715 |
| 2009/0159424 A1* | 6/2009 | Liu | H01J 37/3244 204/164 |
| 2009/0159425 A1* | 6/2009 | Liu | H01J 37/3211 204/164 |
| 2009/0162570 A1* | 6/2009 | Swenberg | H01J 37/3211 427/569 |
| 2009/0221149 A1* | 9/2009 | Hammond, IV | C23C 16/45574 156/345.33 |
| 2009/0230636 A1* | 9/2009 | Goto | H01L 21/6831 279/128 |
| 2009/0233450 A1* | 9/2009 | Sakao | H01L 21/3065 438/716 |
| 2009/0236040 A1* | 9/2009 | Patrick | C23C 16/45565 156/345.34 |
| 2009/0236313 A1* | 9/2009 | Qiu | H01J 37/3244 216/67 |
| 2009/0236314 A1* | 9/2009 | Chen | H01J 37/32091 216/67 |
| 2009/0275210 A1* | 11/2009 | Shanker | C23C 16/04 438/761 |
| 2009/0308840 A1* | 12/2009 | Kohno | C23C 16/4405 216/37 |
| 2009/0311869 A1* | 12/2009 | Okesaku | H01J 37/3244 438/710 |
| 2009/0318912 A1* | 12/2009 | Mayer | A61B 18/20 606/14 |
| 2010/0062214 A1* | 3/2010 | Wo | H01J 37/3244 118/715 |
| 2010/0175713 A1* | 7/2010 | Fukiage | C23C 16/4405 134/1.1 |
| 2010/0230387 A1* | 9/2010 | Okesaku | H01J 37/32449 216/69 |
| 2010/0255218 A1* | 10/2010 | Oka | C23C 16/402 427/579 |
| 2010/0310772 A1* | 12/2010 | Tsuda | C23C 16/409 427/255.28 |
| 2010/0323501 A1* | 12/2010 | Yamazaki | H01J 37/3244 438/479 |
| 2011/0000529 A1* | 1/2011 | Suzuki | C23C 16/45565 136/252 |
| 2011/0011338 A1* | 1/2011 | Chuc | H01J 37/32449 118/715 |
| 2011/0053358 A1* | 3/2011 | Toriumi | C23C 16/24 438/488 |
| 2011/0079356 A1* | 4/2011 | Kim | H01J 37/3244 156/345.33 |
| 2011/0114261 A1* | 5/2011 | Matsumoto | H01J 37/32192 156/345.33 |
| 2011/0114601 A1* | 5/2011 | Lubomirsky | H01J 37/3211 216/68 |
| 2011/0115378 A1* | 5/2011 | Lubomirsky | H01J 37/32357 315/111.21 |
| 2011/0126762 A1* | 6/2011 | Faguet | C23C 16/452 118/723 ER |

(56) References Cited

U.S. PATENT DOCUMENTS

| | | | |
|---|---|---|---|
| 2011/0174606 A1* | 7/2011 | Funk | H01J 37/32009 204/164 |
| 2011/0214812 A1* | 9/2011 | Song | B23P 17/00 156/345.33 |
| 2011/0278260 A1* | 11/2011 | Lai | H01J 37/32532 216/68 |
| 2012/0074108 A1* | 3/2012 | Wo | H01J 37/3244 118/723 VE |
| 2012/0091095 A1* | 4/2012 | Wang | H01J 37/32862 216/37 |
| 2012/0097330 A1* | 4/2012 | Iyengar | B23P 17/00 156/345.33 |
| 2012/0100292 A1* | 4/2012 | Park | C23C 16/4584 118/725 |
| 2012/0138228 A1* | 6/2012 | Zhou | H01J 37/3244 156/345.29 |
| 2012/0152900 A1* | 6/2012 | Chebi | H01J 37/321 216/67 |
| 2012/0180954 A1* | 7/2012 | Yang | H01J 37/3244 156/345.34 |
| 2012/0238102 A1* | 9/2012 | Zhang | C09K 13/00 438/718 |
| 2012/0238103 A1* | 9/2012 | Zhang | C23C 16/45565 156/345.34 |
| 2012/0269968 A1* | 10/2012 | Rayner, Jr. | H01J 37/3244 438/479 |
| 2012/0304933 A1* | 12/2012 | Mai | H01J 37/32091 |
| 2013/0052830 A1* | 2/2013 | Kim | H01L 21/30655 438/700 |
| 2013/0082197 A1* | 4/2013 | Yang | H01J 37/32422 250/505.1 |
| 2013/0089701 A1* | 4/2013 | Hooper | B23K 26/00 428/131 |
| 2013/0105303 A1* | 5/2013 | Lubomirsky | C23C 16/0245 204/192.34 |
| 2013/0112337 A1* | 5/2013 | Okesaku | C23C 16/401 427/255.28 |
| 2013/0206066 A1* | 8/2013 | Han | C23C 16/4401 118/715 |
| 2013/0213467 A1* | 8/2013 | Nattermann | B26F 1/28 136/256 |
| 2013/0288485 A1* | 10/2013 | Liang | H01L 21/02282 438/782 |
| 2013/0306758 A1* | 11/2013 | Park | C23C 16/345 239/418 |
| 2013/0334344 A1* | 12/2013 | Leeser | H01J 37/3244 239/548 |
| 2014/0113084 A1* | 4/2014 | Nguyen | C23C 16/44 427/585 |
| 2014/0150713 A1* | 6/2014 | Coe | C23C 16/274 117/88 |
| 2014/0209817 A1* | 7/2014 | Hultermans | B22D 43/004 250/492.1 |
| 2014/0227881 A1* | 8/2014 | Lubomirsky | C23C 16/45565 438/710 |
| 2014/0235069 A1* | 8/2014 | Breiling | H01J 37/3244 156/345.34 |
| 2014/0252134 A1* | 9/2014 | Chen | C23C 16/45578 118/715 |
| 2015/0020973 A1* | 1/2015 | Arami | H01J 37/3244 156/345.29 |
| 2015/0036969 A1* | 2/2015 | Safar | H01J 37/32449 438/10 |
| 2015/0211123 A1* | 7/2015 | Glukhoy | C23C 16/453 118/712 |
| 2015/0214009 A1* | 7/2015 | Glukhoy | H01J 37/32192 156/345.33 |
| 2015/0214013 A1* | 7/2015 | Glukhoy | H01J 37/32192 118/723 MW |
| 2015/0275361 A1* | 10/2015 | Lubomirsky | C23C 16/45578 427/569 |
| 2015/0376782 A1* | 12/2015 | Griffin | C23C 16/4584 118/712 |
| 2016/0032451 A1* | 2/2016 | Kurita | H01J 37/32357 134/1.1 |
| 2016/0340781 A1* | 11/2016 | Thomas | C23C 16/45519 |
| 2017/0114462 A1* | 4/2017 | Zhang | H01J 37/32899 |
| 2017/0148612 A1* | 5/2017 | Suzuki | H01L 21/3065 |
| 2017/0178915 A1* | 6/2017 | Ingle | C23C 16/04 438/761 |
| 2017/0298512 A1* | 10/2017 | Yamada | C23C 16/45544 427/248.1 |
| 2019/0295826 A1* | 9/2019 | Wang | C23C 16/45544 438/763 |

FOREIGN PATENT DOCUMENTS

| | | | | |
|---|---|---|---|---|
| CN | 101308784 | | 11/2006 | |
| CN | 101268554 | | 9/2008 | |
| CN | 101467498 | | 6/2009 | |
| CN | 10151771 | | 8/2009 | |
| CN | 101643904 A | * | 2/2010 | ......... H01J 37/3244 |
| CN | 101842873 | | 9/2010 | |
| JP | 2002009065 A | * | 1/2002 | ......... C23C 16/455 |
| JP | 2000340551 | | 5/2002 | |
| JP | 2003-332326 | | 11/2003 | |
| JP | 2006-210929 | | 8/2006 | |
| KR | 10-2001-0004243 A | | 1/2001 | |
| KR | 10-2004-0007533 B1 | | 1/2004 | |
| KR | 10-0578138 B1 | | 5/2006 | |
| KR | 10-0785443 B1 | | 12/2007 | |
| KR | 20-2008-0003158 | | 8/2008 | |
| KR | 10-2009-0086351 A | | 8/2009 | |
| TW | 200822714 | | 5/2008 | |
| TW | 200822814 | | 5/2008 | |
| TW | 200845831 | | 11/2008 | |
| TW | I704618 | | 9/2020 | |
| TW | I 740489 | | 9/2021 | |
| WO | WO 2002090615 | | 11/2002 | |
| WO | WO-2007145229 A1 | * | 12/2007 | ........ H01J 37/32449 |
| WO | WO-2009104732 A1 | * | 8/2009 | .......... C23C 16/409 |
| WO | WO-2010004836 A1 | * | 1/2010 | .......... H01J 37/3244 |
| WO | WO-2011095846 A1 | * | 8/2011 | ......... C23C 16/5096 |

OTHER PUBLICATIONS

International Search Report and Written Opinion for corresponding International Application No. PCT/US2011/054953, dated May 2, 2012, 10 pages.

International Preliminary Report on Patentability for International Application No. PCT/US2011/054953, dated Apr. 25, 2013, 7 pages.

Notice of Second Action (Non-Final) from the Chinese State Intellectual Property Office; dated Sep. 15, 2015 for Chinese Patent Application No. 201180049185.X, 16 pages and translation thereof.

Official Letter from Taiwan Patent Application No. 100137411 dated Jun. 15, 2017, 8 pgs.

Search Report for Taiwan Patent Application No. 106135228 dated May 11, 2018, 8 pgs.

Office Action for Taiwan Patent Application No. 107127207, dated Jan. 24, 2019, 10 pgs.—with English translation of the Office Action.

First Office Action from Chinese Patent Application No. 201810036470.1, dated May 9, 2019, 15 pgs.

Official letter from Taiwan Patent Application No. 108113701 dated Oct. 28, 2019, 7 pgs.

Notice of Second Office Action from Chinese Patent Application No. 201810036470 dated Jan. 6, 2020, 11 pgs.

Official letter from Taiwan Patent Application No. 108125159 dated Feb. 13, 2020, 11 pgs.

Official Letter from Taiwanese Patent Application No. 108113701 dated Feb. 27, 2020, 11 pgs.

Notice of Third Office Action from Chinese Patent Application No. 201810036470.1 dated Aug. 4, 2020, 12 pgs.

Notice of Fourth Office Action from Chinese Patent Application No. 201810036470.1 dated Mar. 3, 2021, 14 pgs.

(56) References Cited

OTHER PUBLICATIONS

Notice of First Office Action from Chinese Patent Application No. 201180049185.X dated Jan. 22, 2015, 7 pgs.
Notice of Third Office Action from Chinese Patent Application No. 201180049185.X dated Feb. 14, 2016, 16 pgs.
Decision on Rejection from Chinese Patent Application No. 201180049185.X dated Jul. 18, 2016, 12 pgs.
Decision of Reexamination from Chinese Patent Application No. 201180049185.X dated Oct. 30, 2017, 14 pgs.
Telephone Notification from Chinese Patent Application No. 201810036470.1 dated Feb. 23, 2021, 2 pgs.
Notice of Office Action from Korean Patent Application No. 10-2013-7009571 dated Mar. 20, 2017, 5 pgs.
Notice of Office Action from Korean Patent Application No. 10-2013-7009571 dated Sep. 28, 2017, 4 pgs.
Non-Final Office Action from U.S. Appl. No. 13/174,090 dated Jul. 2, 2013, 10 pgs.
Final Office Action from U.S. Appl. No. 13/174,090 dated Dec. 30, 2013, 12 pgs.
Non-Final Office Action from U.S. Appl. No. 13/174,090 dated Apr. 30, 2014, 10 pgs.
Final Office Action from U.S. Appl. No. 13/174,090 dated Aug. 11, 2014, 12 pgs.
Non-Final Office Action from U.S. Appl. No. 13/174,090 dated Mar. 12, 2015, 14 pgs.
Final Office Action from U.S. Appl. No. 13/174,090 dated Jul. 7, 2015, 16 pgs.
Non-Final Office Action from U.S. Appl. No. 13/174,090 dated Dec. 11, 2015, 17 pgs.
Final Office Action from U.S. Appl. No. 13/174,090 dated Apr. 26, 2016, 14 pgs.
Non-Final Office Action from U.S. Appl. No. 13/174,090 dated Sep. 10, 2018, 24 pgs.
Final Office Action from U.S. Appl. No. 13/174,090 dated Jan. 8, 2019, 22 pgs.
Official Letter from Taiwan Patent Application No. 109115278 dated Feb. 25, 2021, 7 pgs.
Official Letter from Taiwan Patent Application No. 110118603 dated Mar. 30, 2022, 8 pgs.

* cited by examiner

METHOD AND APPARATUS FOR REDUCING PARTICLE DEFECTS IN PLASMA ETCH CHAMBERS

CROSS-REFERENCE TO RELATED APPLICATIONS

This application is a divisional of U.S. patent application Ser. No. 13/174,090, filed on Jun. 30, 2011, which claims priority from U.S. patent application Ser. No. 61/413,315, filed on Nov. 12, 2010, and from U.S. patent application Ser. No. 61/393,729, filed on Oct. 15, 2010, the entire contents of which are hereby incorporated by reference herein.

BACKGROUND

1. Field

Embodiments of the present invention relate to the electronics manufacturing industry and more particularly to in-situ cleaning and conditioning of plasma processing chambers.

2. Discussion of Related Art

As the feature size of microelectronic devices shrinks elemental contamination originating from the processing equipment employed to fabricate the devices becomes more detrimental to device performance. Plasma processing equipment, such as those designed to perform plasma etching, may include a variety of chamber materials, including alumina, yttria, and zirconia, and any of these can pose a source for metallic contamination of advanced devices. Such contamination can be all the more problematic as it may be a function of the chamber age.

Conditioning of a plasma processing chamber may be performed to prevent a plasma from interacting with the chamber materials and transferring contaminants from the chamber materials to the workpiece (e.g., wafer of devices under manufacture) during a plasma processing. For example, as shown in FIG. 1, a plasma etch chamber 100 includes a chuck 102 upon which a workpiece 101 is disposed during processing with a plasma 103. The chuck 102, chamber liner 105, chamber lid 107, and bottom surface 112 of gas nozzle 110 are all isolated from exposure to the plasma 103 by a chamber coating 115 which has been deposited onto the chamber materials with one or more plasma processes prior to loading the workpiece 101 in the plasma etch chamber 100.

However, a drawback of the chamber coating 115 is that the coating itself may cause contamination of the workpiece 101, often in the form of particulate defects when the coating sheds from the chamber materials and falls onto the underlying workpiece 101. As such, the practice of chamber coating may merely trade one type of device contamination for another.

SUMMARY

In embodiments of the present invention, in-situ low pressure chamber cleans and gas nozzles are used for plasma processing systems employing in-situ chamber coatings to reduce particle defects caused by shedding of the coatings from gas nozzle holes. Certain chamber clean embodiments for conductor etch applications include an $NF_3$-based plasma clean performed at pressures below 30 mT to remove in-situ deposited $SiO_x$ coatings on interior surfaces of gas nozzle holes. Embodiments include gas nozzles with bottom holes dimensioned sufficiently small to reduce or eliminate build up of $SiO_x$ coating on interior surface of nozzle holes.

In one embodiment, a coating comprising $SiO_x$ is deposited onto a chamber surface with a first plasma process, a workpiece is etched in the plasma chamber with a second plasma process when the chamber has the $SiO_x$ coating. The chamber surface is cleaned to prevent shedding of the $SiO_x$ with a low pressure plasma clean utilizing a first process gas including $NF_3$ and a process pressure between about 3 mT and 30 mT.

With the low pressure plasma clean is directed at cleaning holes in the gas nozzle, certain embodiments also include a high pressure plasma clean utilizing a second process gas including $NF_3$ at a process pressure no less than 100 mT. The high pressure plasma clean may further include source gases, such as $Cl_2$ and $O_2$ to remove polymers and metal deposits from the chamber. The high pressure plasma clean may be performed prior to the low pressure clean with the low pressure clean being substantially only $NF_3$.

In plasma processing chamber embodiments, a gas nozzle includes at least one entrance hole having a first diameter recessed into an upstream side of the gas nozzle, and at least one exit hole, having a second diameter smaller than the first, recessed into a downstream side of the gas nozzle physically joined to one an entrance hole. The second diameter is 900 μm or less to remove or prevent the build-up of chamber coatings, such as $SiO_x$, on the interior hole surface.

In further embodiments, the gas nozzle includes a plurality of entrance holes and a plurality of exit holes recessed into a downstream side of the gas nozzle. The plurality of exit holes are arranged into a plurality of subsets with each subset of exit holes joined to one of the plurality of entrance holes to blend the entrance hole with the subset of exit holes. Each of the exit holes in the subset has a diameter dimensioned so that the subset of exit holes occupies an area on a downstream side of the gas nozzle that is no greater than an area the joined entrance hole occupies on the upstream side of the gas nozzle.

DETAILED DESCRIPTION

Figure 1:
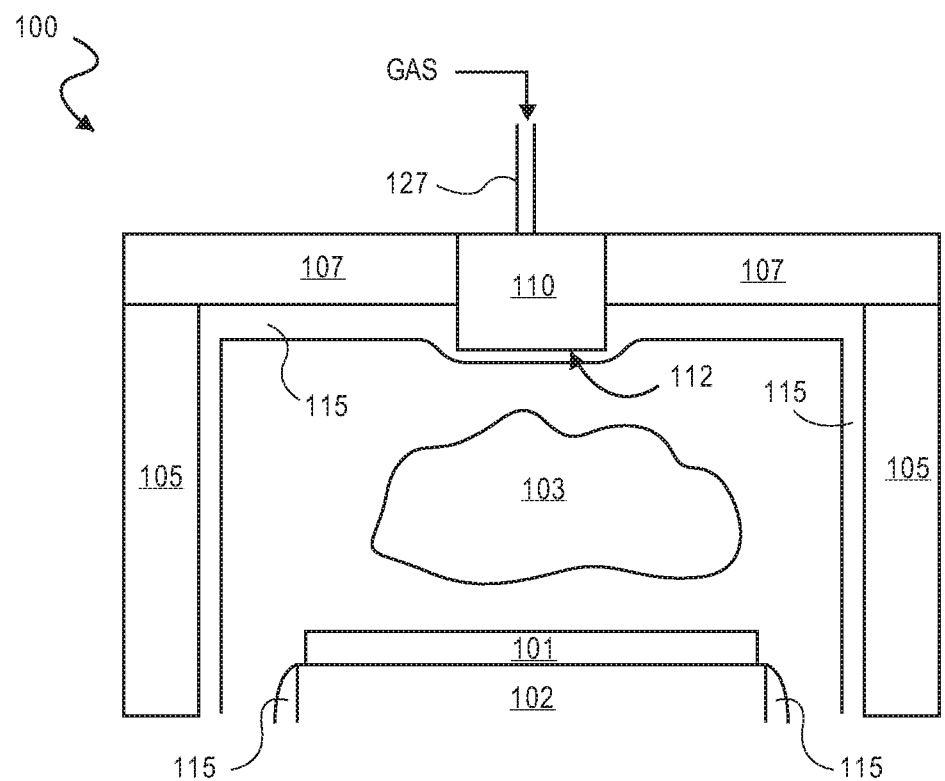
FIG. 1 illustrates a cross sectional view of a plasma etch apparatus including a chamber coating.

In the following description, numerous specific details are set forth to provide a thorough understanding of the present invention. It will be apparent to one skilled in the art that the present invention may be practiced without these specific details. In other instances, well-known features, such as specific chambers, materials, and etching techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

Generally, a steady state condition for the chamber coating 115 is desired, which is dependent on the critical minimum/maximum thicknesses of the chamber coating 115 needed/tolerated, and the dynamics balance between coating deposition and coating erosion during plasma processing. To achieve steady state, deposition of the chamber coating 115 prior to processing the workpiece 101 may be balanced with periodic removal of the chamber coating 115 to maintain a controlled coating state as multiple workpieces are processed through the chamber. Periodic coating removal may be performed with an in-situ chamber clean that is generally performed without a workpiece present on the chuck (i.e., a wafer-less, in-situ chamber clean, or ICC). Periodic coating removal may be performed after a fixed number of workpieces and/or in-situ coating processes have been performed. For example, a clean of the chamber to remove at least a portion of the coating may be performed after each workpiece processed and/or before each coating deposition process.

It has been found that for certain chamber coatings 115, conventional ICC processes capable of completely removing the chamber coating 115 from surfaces of the liner 105, lid 107, and chuck 102 are incapable of completely removing the chamber coating 115 from one or more interior surfaces of exit holes present in the gas nozzle 110. In particular, investigations in yield excursions attributed to a conductor etch process of IC manufacture identified an accumulation of chamber coating 115 in the interior of bottom exit holes in the gas nozzle 110 which are disposed substantially above the workpiece 101. Generally, the gas nozzle 110 is present in most any plasma processing chamber as the means to distribute a process gas into the chamber. The gas nozzle 110 has an upstream side where gas is introduced from a gas stick 127 and a downstream side where gas is introduced from the nozzle exit holes to the chamber interior.

With knowledge that the coating material was building up in the gas nozzle, enhanced ICC processes were developed to improve cleaning efficiency of the exit holes. Generally speaking, one of the characteristics of the enhanced ICC embodiments is an increased mean-free path relative to a conventional ICC process which is often tailored for highest throughput and/or multiple types of residues. With the enhanced ICC embodiments described herein, exit holes of any type in virtually any plasma processing system, and more particularly any plasma etch system, may be better cleaned of the chamber coating. Nozzle exit hole topologies were also investigated with one of the measured responses being surface analysis of the exit hole inner surface. The enhanced nozzle exits hole topologies described herein, when utilized in any plasma processing system, and more particularly any plasma etch system, may better resist build up of a coating material.

Figure 2:
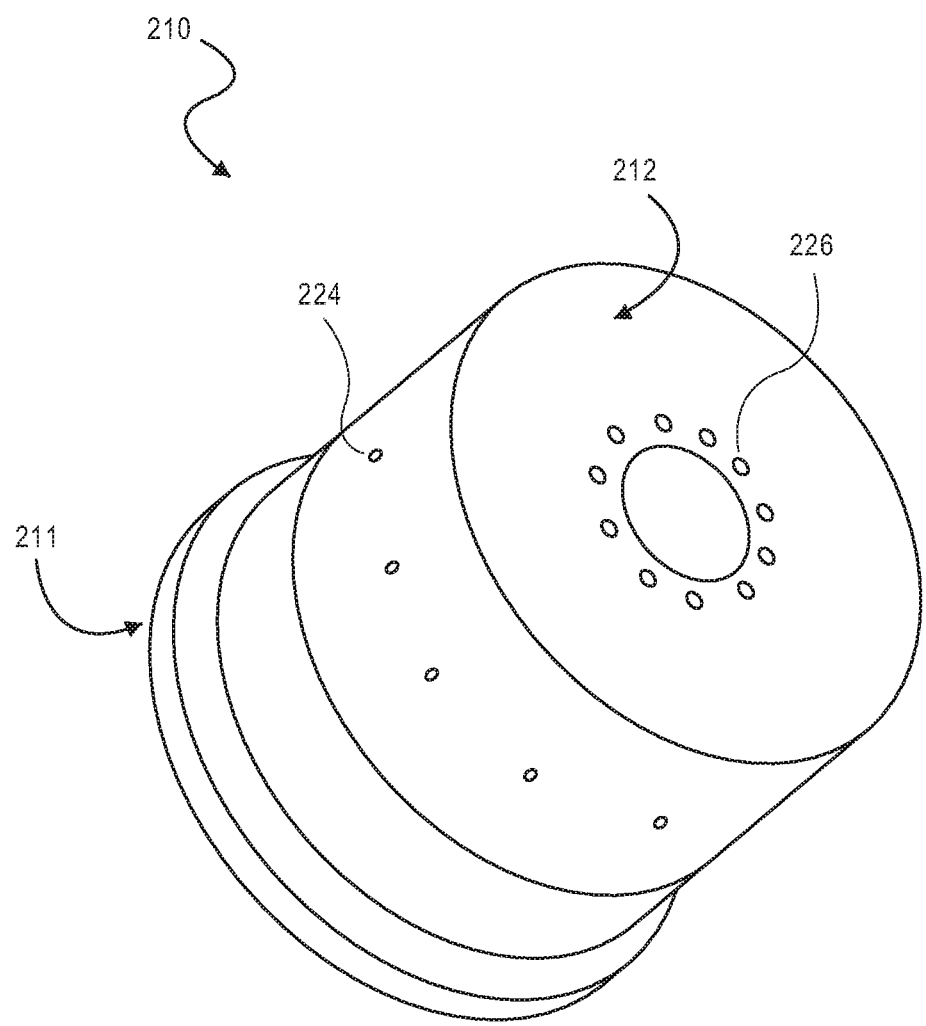
FIG. 2 illustrates an isometric view of a downstream side of a gas nozzle, in accordance with an embodiment of the present invention.

FIG. 2 illustrates an isometric view of a downstream side 212 of a gas nozzle 210, in accordance with an embodiment of the present invention. As shown, gas enters the nozzle 210 via the upstream side 211. In this particular embodiment, some portion of gas exits from the nozzle 210 via side holes 224, while the remainder exits through bottom holes 226 formed in the downstream side 212. While the exemplary embodiment illustrated in FIG. 2 includes both side holes 224 and bottom holes 226 to provide for enhanced tuning of a plasma process, any nozzle or showerhead configuration which includes exits holes in the downstream side 212 (with or without side holes 224) can suffer from a net accumulation of chamber coating 115.

In one embodiment the chamber coating 115 is an inorganic layer. In the exemplary conductor etch embodiment, the chamber coating 115 includes $SiO_x$. A $SiO_x$-based chamber coating is particularly advantageous for conductor etch applications, such as gate polysilicon or gate metal alloy etch operations because these etch processes generally have high selectivity to $SiO_x$, and the presence of $SiO_x$ on the chamber can reduce contamination of the workpiece by the chamber materials. However, it should be noted that the chamber coating 115 may include other constituents, such as Cl in a $SiO_xCl_y$ coating formed where a $SiCl_4$ source gas is employed to deposit the chamber coating 115. The chamber coating 115 may also be inorganic films other than the exemplary $SiO_x$, embodiment, for example the coating may be predominantly SiN. In still other embodiments, the chamber coating 115 is an organic coating, although such coatings generally lack the advantages of $SiO_x$ in a conductor etch applications.

Figure 3:
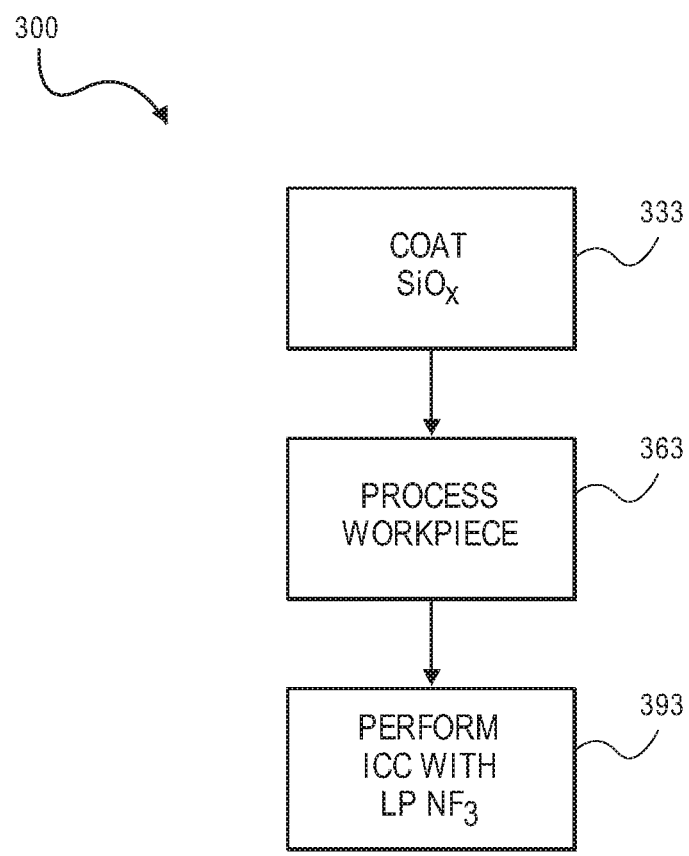
FIG. 3 is a flow diagram illustrating a chamber coat and clean process, in accordance with an embodiment of the present invention.

FIG. 3 is a flow diagram illustrating a chamber coat and clean process, in accordance with an embodiment of the present invention. Method 300 may be performed with a plasma processing system and more particular with a plasma etch system, such as that depicted in FIG. 5, during a fabrication process. At operation 333, an in-situ plasma chamber coating process is performed to deposit a chamber coating 115 in preparation for processing of a workpiece. In the exemplary embodiment, an $SiO_x$-based coating is formed at operation 333. In one such embodiment, a silicon-containing source gas, such as but not limited to $SiCl_4$, is employed with an oxidizing source gas, such as but not limited to $O_2$ and $N_2O$. Process pressures may be anywhere between 3 mT and 300 mT. Higher coating process pressures may reduce build up of coating material in the nozzle exit holes. However, in embodiments, the process pressure utilized in the coating operation 333 is to be less than the process pressure utilized in processing of the workpiece at operation 363 in an effort to ensure regions of the chamber which interact with the process plasma of operation 363 are not left uncoated by operation 333. Silicon source to oxidizer flow ratios between anywhere between 4:1 and 1:4 with 2:1 being an exemplary process for a $SiCl_4$:$O_2$ coating process. Coat process duration may be anywhere between about 10 and 60 seconds.

With the chamber coated, method 300 proceeds to operation 363 with processing of a workpiece. Generally, a workpiece may be any substrate conventionally employed in the fields of microelectronic, nanotechnology, photovoltaics, or the like. As one exemplary embodiment, the workpiece is a semiconductor wafer, such as, but not limited to silicon, germanium, or a commonly known III-V compound semiconductor material. As another embodiment, workpiece is a glass or sapphire material. In general, any plasma process commonly employed in the art may be performed at operation 363. In certain embodiments, a plasma etching of a workpiece is performed at operation 363 with the exemplary embodiment being a conductor etch process. Many conductor etch processes are known in the art and any etch applicable to polysilicon or any metal alloy in use for gate electrodes may be performed at operation 363. In a particular embodiment, the bulk of plasma etching at operation 363 is performed with a process having a selectivity of over 10:1 to the $SiO_x$ chamber coating and preferably over 20:1.

At operation 393, a low pressure ICC is performed to reset the state of the process chamber in preparation for processing of another workpiece. In the exemplary conductor etch embodiment, operation 393 is performed after the workpiece processed at operation 363 is unloaded from the chamber. In one such embodiment, the low pressure ICC operation 393 is performed without any dummy workpiece (e.g., waferless).

In an embodiment a low pressure ICC utilizes a first process gas including fluorine and a relatively low process pressure. Fluorine-based process gases are well-suited for etching most inorganic chamber coatings, particularly the exemplary $SiO_x$-based coatings. While any of a number of known fluorine-based process gases, such as, but not limited to $SF_6$ and $CF_4$ may be used, in the exemplary embodiment $NF_3$ is utilized. $NF_3$ may offer an advantage of longer reactive species than does $CF_4$, for example. In embodiments, a plasma of the first process gas is generated at a process pressure less than that utilized in processing of the workpiece. In certain embodiments, a plasma of the first process gas is generated at a process pressure no greater than 30 mT. This low pressure enhances the removal of coatings, such as SiOx-based coatings formed in gas nozzle exit holes. Generally, decreasing pressure below 30 mT will monotonically increase the mean free path, so pressures less than 10 mT are advantageous with pressures between 3 mT and 6 mT even more efficient at removing coatings formed in gas nozzle exit holes. In the exemplary conductor etch application where a $SiO_x$ coating is formed at operation 333, the $SiO_x$-based coating is etched with a first process gas consisting only of $NF_3$ at a pressure of 6 mT or less. A mixing of other source gases may be avoided for the benefit of lowest process pressure. However, in other embodiment, inerts such as He, Ar, or $N_2$, etc, may be added in small amounts for benefit of plasma stability. Similarly, other reactive species such as $Cl_2$ (or $BCl_3$ where no oxidizer is present) may be added to the first process as long as the advantageous low process pressure is maintained. RF source power of between 1000 W and 4000 W may be utilized to energize the low pressure plasma with at least 2000 W offering an advantage of stability. RF bias power may be minimal to avoid damage to the chuck with the exemplary embodiment having an RF bias power of 0 W.

In an embodiment, the ICC operation 393 further includes a high pressure plasma clean utilizing a second process gas at a process pressure no less than 100 mT. In particular embodiments the high pressure plasma clean is performed at a pressure between 200 mT and 500 mT. In certain conductor etch embodiments, the second process gas includes at least $NF_3$ at a pressure between 200 mT and 300 mT. In the exemplary conductor etch embodiment the second process gas includes $NF_3$ along with at least one other reactive species, such as $Cl_2$ and/or an oxidizer, such as $O_2$, NO, CO, and COS. Addition of chlorine-based source gases may be useful for cleaning the chamber after a conductor etch involving an etching of a titanium alloy, such as TiN. Chlorine-containing source gas may also help to remove of $AlF_3$ which may form on the chuck during operation 363. Addition of the oxidizer is useful for cleaning polymers which may be deposited on the chamber walls during the workpiece etch operation 363. For certain embodiments where an oxidizer is utilized, the high pressure clean is performed until an endpoint criteria is achieved indicating the carbonaceous polymers have been removed from the chamber. Inerts such as He, Ar, or $N_2$, etc, may also be added to the high pressure clean. RF source power of between 1000 W and 4000 W may be utilized to energize the low pressure plasma with at least 1500 W offering an advantage of stability. RF bias power may be minimal to avoid damage to the chuck with the exemplary embodiment having an RF bias power of 0 W.

In particular embodiment, the high pressure clean of operation 393 is performed prior to the low pressure clean of operation 393. A high pressure clean performed first removes material deposited onto the chamber coating 115 during the etch operation 363 and may also remove a considerable amount of the chamber coating 115. The low pressure clean then cleans up any remainder of the chamber coating 115 and as such, may be a timed process performed for a predetermined duration of 5 to 30 seconds, for example. In further embodiments, a plasma is maintained during the transition from the high pressure clean to the low pressure clean to avoid striking the low pressure plasma.

Figure 4A:
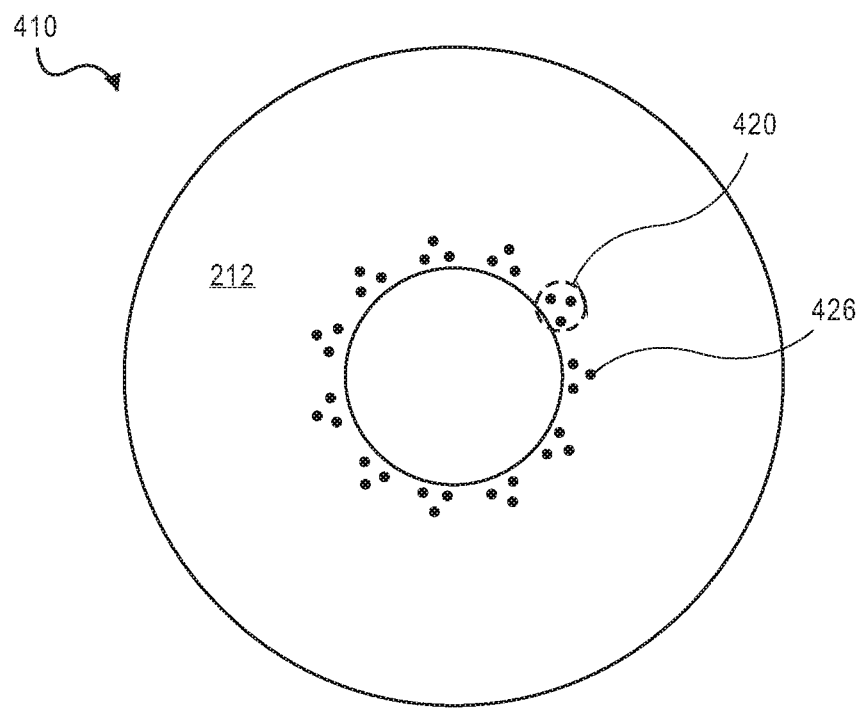
FIG. 4A illustrates a plan view of a downstream side of a gas nozzle, in accordance with an embodiment of the present invention

In an embodiment gas nozzle exit holes are constructed to reduce build up on chamber coatings, such as the exemplary $SiO_x$ coating. FIG. 4A illustrates a plan view of a downstream side 212 of a ytteria ($Y_2O_3$) gas nozzle 410, in accordance with an embodiment of the present invention. As shown, bottom exit holes 426 are dimensioned to be smaller than at least one entrance hole 420 having a first diameter recessed into an upstream side of the gas nozzle. In the exemplary embodiment, a plurality of bottom exit holes 426 are joined with a single entrance hole 420. For example, in the embodiment depicted in FIG. 4A, a bottom exit holes are arranged into subsets (e.g., twelve for depicted embodiment) with each subset including three bottom exit holes 426. Each of the exit holes in a subset has a diameter dimensioned so that each subset of exit holes occupies an area on the downstream side 212 that is no greater than an area the entrance hole 420 occupies on the upstream side of the gas nozzle.

Figure 4B:
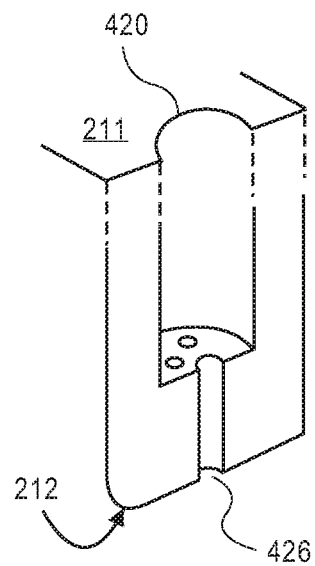
FIG. 4B illustrates an isometric cross-sectional view of a union between an entrance hole and group of bottom exit holes in the gas nozzle depicted in FIG. 4B, in accordance with an embodiment of the present invention.
Figure 4C:
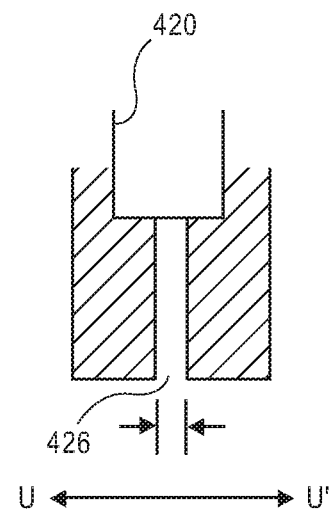
FIG. 4C illustrates a cross-sectional view of one bottom exit hole in the gas nozzle depicted in FIG. 4A, in accordance with an embodiment of the present invention.
Figure 4D:
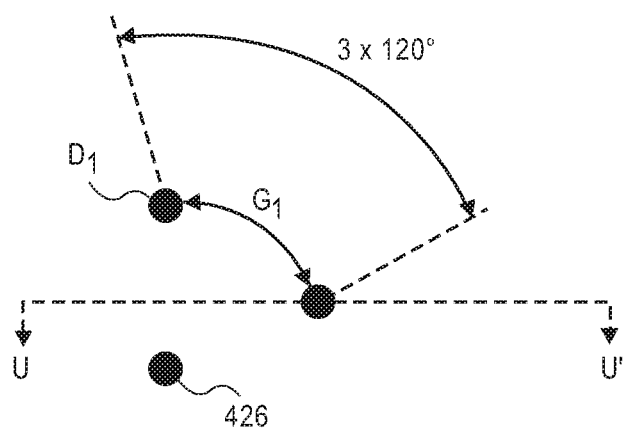
FIGS. 4D and 4E illustrate plan views of exit hole groups for gas nozzles in accordance with embodiments of the present invention.

FIG. 4B illustrates an isometric sectional view of a blend between the entrance hole 420 and subset of bottom exit holes 426 in the gas nozzle 410, in accordance with an embodiment. FIG. 4C illustrates a cross-sectional view of one bottom exit hole 426 while FIG. 4D illustrates plan view of on exit hole subset for the gas nozzle 410, in accordance with an embodiment of the present invention. As shown in FIG. 4C, the bottom exit hole 426 has a diameter $D_1$. Generally, $D_1$ is dimensioned to reduce formation of coatings, such as $SiO_x$, on the inner surface of the bottom exit hole 426. In an embodiment, $D_1$ is 800 μm or less with little $SiO_x$ deposition observed for exit holes of 500 μm and no $SiO_x$ deposits observed for exemplary embodiments with $D_1$ of 300 μm and less. With $SiO_x$ deposition found on larger diameter exit holes, hole diameter was found to decrease with chamber use, potentially adversely impacting a process plasma. As such, the low pressure cleans described elsewhere herein become more important for embodiments where diameters are greater than 800 μm.

Figure 4E:
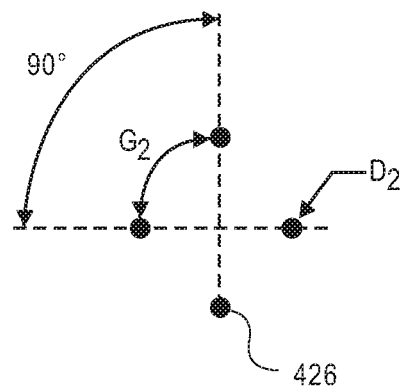

The position of the blend between entrance hole 420 and bottom exit hole 426 within the bulk of the nozzle 410 is varied based on conduction and uniformity requirements of the process with $SiO_x$ deposition reduced as a function of depth into the exit hole. Generally, the bottom exit hole 426 should have a recess depth of between 1 and 10 times $D_1$, or about 250 μm and 4000 μm with the exemplary embodiment having a recess depth of at least five times $D_1$. As shown in FIG. 4D, three bottom exit holes 426 are separated by a 120° arc with $G_1$ being between 250 and 300 μm to arrive at a suitable minimum wall thickness for machining, 0.015" for example. Reductions in $D_1$ therefore permit a greater number of exit holes within a given area of the downstream side 412, with FIG. 4E illustrating a plan view of exit hole groups for gas nozzles in accordance with an alternate embodiment employing four bottom holes 426 separated by 90° arcs with $D_1$ of 250 μm and maintaining 0.015" wall thicknesses. Of course, other exit hole arrangements are possible without deviating from the advantageous dimensional properties illustrated by these exemplary embodiments.

Figure 5:
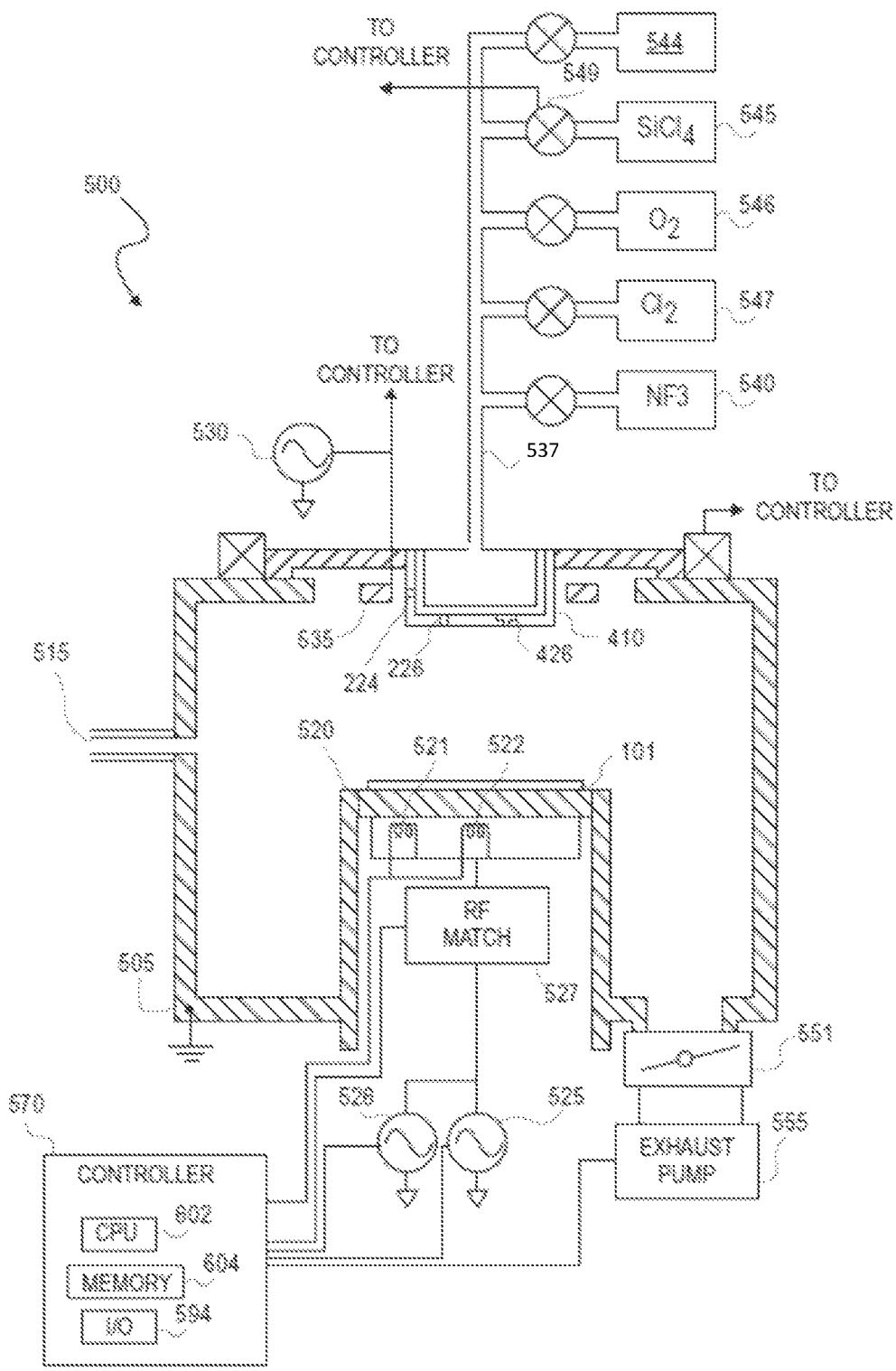
FIG. 5 is a schematic of a plasma etch system configured to perform the chamber coat and clean process, in accordance with an embodiment of the present invention.

FIG. 5 is a schematic of a plasma etch system configured to perform the chamber coat and clean process, in accordance with an embodiment of the present invention. Exemplary embodiments of the plasma chamber coat and clean methods described herein may be performed with a plasma etch apparatus, such as the DPS AdvantEdge etch chamber manufactured by Applied Materials, Inc. of CA, USA. In another embodiment, all the plasma etch processes of method 200 are performed in the DPS AdvantEdge etch chamber, or alternate etch chamber designs, such as the, Enabler™, MxP®, MxP+™, Super-E™ or E-MAX® chamber also manufactured by Applied Materials, Inc. of CA, USA. Other types of high performance etch chambers known in the art may also be used.

A cross-sectional view of an exemplary etch system 500 is shown in FIG. 5. System 500 includes a grounded chamber 505. A workpiece 101 is loaded through an opening 515 and clamped to a temperature controlled chuck 520. In particular embodiments, temperature controlled chuck 520 include a plurality of zones, each zone independently controllable to a temperature setpoint, such as with a first thermal zone 522 proximate a center of substrate 510 and a second thermal zone 521 proximate to a periphery of workpiece 101. Process gases, are supplied from gas sources 544, 545, 546, 547 and 548 through respective mass flow controllers 549 to the interior of the chamber 505 via a gas stick 537. In certain embodiments, a gas nozzle 410 provides for distribution of process gases, such as a conductor etchant gas mixture 544. The gas nozzle 410 may include conventionally dimensioned bottom holes 226 or bottom exit holes 426, dimensioned as described elsewhere herein, for various embodiments. The gas nozzle 410 may further include side holes 224, as described elsewhere herein. As shown, the bottom exit holes 226 or 426 are disposed directly above the workpiece 101 with a downstream side of the gas nozzle 410 substantially parallel to the temperature controlled chuck 520.

In embodiments, periodic chamber coating is performed with $SiCl_4$ source gas 545 and $O_2$ source gas 546. In further embodiments, periodic chamber cleaning with $NF_3$ source gas 540 is performed at a low pressure. Other chamber clean embodiments include addition cleaning with $Cl_2$ source gas 547 and/or $O_2$ source gas 546. During at least the low pressure $NF_3$ chamber clean, the chamber 505 is evacuated to between 5 mTorr and 30 mTorr via an exhaust valve 551 connected to a high capacity vacuum pump stack 555 including a turbo molecular pump.

When RF power is applied processing of a workpiece or a chamber coat or ICC process described herein, a plasma is formed in chamber processing region over workpiece 101. Bias power RF generator 525 is coupled to the temperature controlled chuck 520. Bias power RF generator 525 provides bias power, if desired, to energize the plasma. Bias power RF generator 525 may have a low frequency between about 2 MHz to 60 MHz for example, and in a particular embodiment, is in the 13.56 MHz band. In certain embodiments, the plasma etch system 500 includes a third bias power RF generator 526 at a frequency at about the 2 MHz band which is connected to the same RF match 527 as bias power RF generator 525. Source power RF generator 530 is coupled through a match (not depicted) to a plasma generating element 535 to provide a source power to energize the plasma. Source RF generator 530 may have a frequency between 100 and 180 MHz, for example, and in a particular embodiment, is in the 162 MHz band. Because substrate diameters have progressed over time, from 150 mm, 200 mm, 300 mm, etc., it is common in the art to normalize the source and bias power of a plasma etch system to the substrate area.

Figure 6:
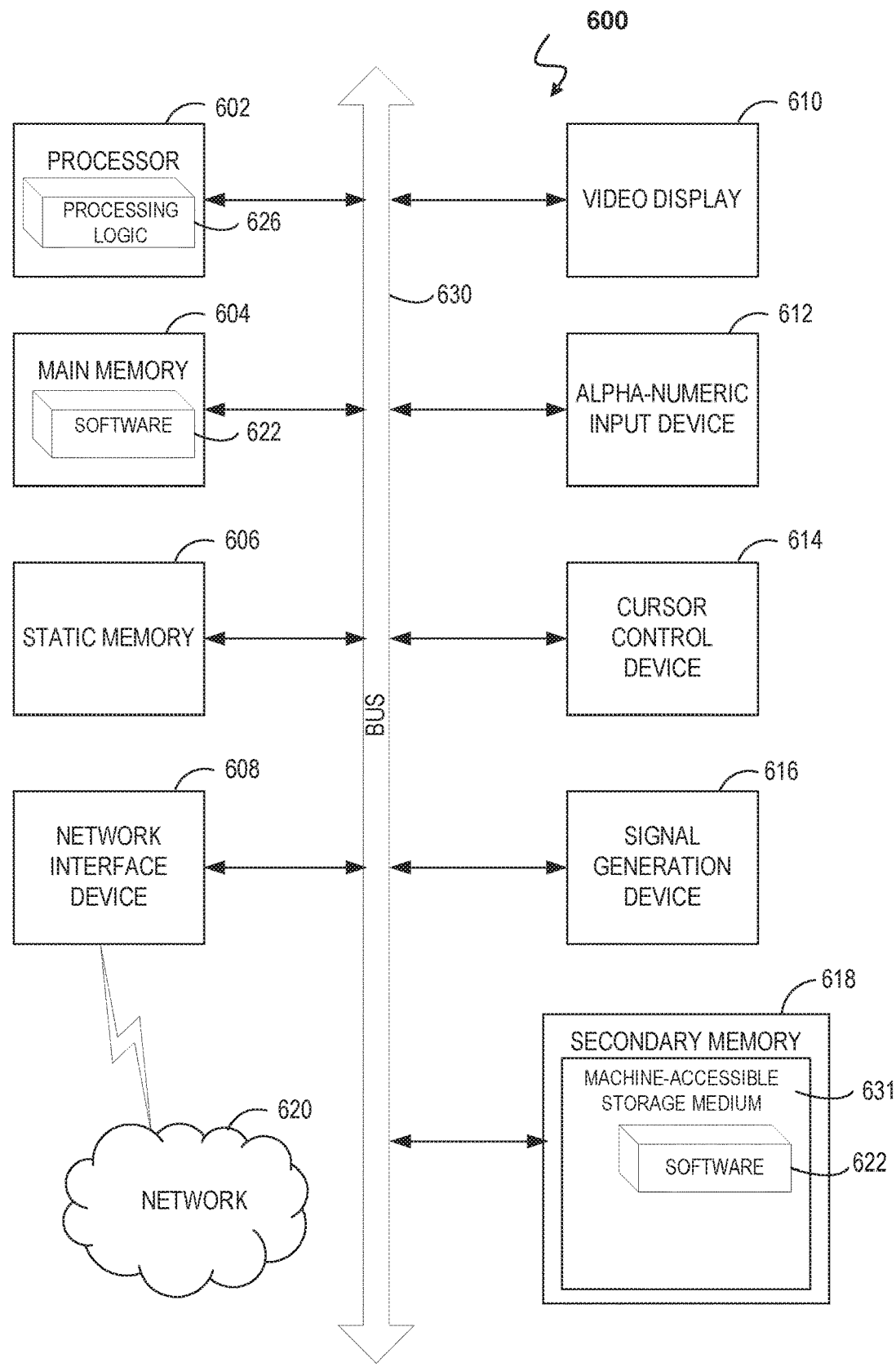
FIG. 6 is a block diagram of a processing system which is incorporated in the plasma etch system FIG. 5 to automatically perform the chamber coat and clean process, in accordance with an embodiment of the present invention.

FIG. 6 illustrates a diagrammatic representation of a machine in the exemplary form of a computer system 600 which may be utilized to perform the ICC operations described herein. In one embodiment, the computer system 600 may be provisioned as the controller 570 in the plasma etch system 500. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine (e.g., via commands set through I/O 594). Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

The processor 602 represents one or more general-purpose processing devices such as a microprocessor, central processing unit, or the like. The processor 602 may a general purpose device or a special-purpose processing device such as an application specific integrated circuit (ASIC), a field programmable gate array (FPGA), a digital signal processor (DSP), network processor, or the like. The processor 602 is configured to execute the processing logic 626 for performing the ICC operations discussed elsewhere herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the ICC algorithms described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

The machine-accessible storage medium 631 may further be used to store a set of instructions for execution by a processing system and that cause the system to perform any one or more of the chucking and/or dechucking algorithms described herein. Embodiments of the present invention may further be provided as a computer program product, or software, that may include a machine-readable medium having stored thereon instructions, which may be used to program a computer system (or other electronic devices) to control a substrate chucking and dechucking temperatures according to the present invention as described elsewhere herein. A machine-readable medium includes any mechanism for storing \information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other non-transitory storage media.

Although the present invention has been described in language specific to structural features and/or methodological acts, it is to be understood that the invention defined in the appended claims is not necessarily limited to the specific features and embodiments described.

What is claimed is:

1. A plasma processing chamber gas nozzle, comprising:
   a plurality of entrance holes having a first diameter recessed into an upstream side of the gas nozzle, each of the plurality of entrance holes having the first diameter;
   at least one side hole recessed into a side of the gas nozzle and physically jointed to at least one entrance hole of the plurality of entrance holes, wherein an opening of the side hole passes through a sidewall of the entrance hole, and
   a plurality of exit holes, having a second diameter smaller than the first diameter, recessed into a downstream side of the gas nozzle and physically joined to an entrance hole, wherein each of the plurality of exit holes has the second diameter, wherein the plurality of exit holes are arranged into a plurality of subsets, and each subset of exit holes is joined to one of the plurality of entrance holes, wherein each of the exit holes in the subset has a diameter dimensioned so that the subset of exit holes occupies an area on the downstream side of the gas nozzle that is no greater than an area the joined entrance hole occupies on the upstream side of the gas nozzle, and wherein the second diameter is between 250 μm and 800 μm, and wherein a minimum wall thickness between each of the plurality of exit holes in a subset is between 380 μm and 7,500 μm.

2. The gas nozzle of claim 1, wherein the second diameter is between 250 μm and 500 μm.

3. The gas nozzle of claim 1, wherein the at least one exit hole has a recess depth of at least five times the second diameter.

4. The gas nozzle of claim 1, wherein each subset of exit holes comprises at least three exit holes.

5. The gas nozzle of claim 1, wherein the chamber gas nozzle is coupled to a source of $SiCl_4$.

6. A plasma etch system, comprising:
   a chamber to contain a workpiece in a plasma environment;
   a gas stick coupled to the chamber to provide a process gas through a gas nozzle, the gas nozzle, further comprising:
     a plurality of entrance holes having a first diameter recessed into an upstream side of the gas nozzle each of the plurality of entrance holes having the first diameter;
     at least one side hole recessed into a side of the gas nozzle and physically jointed to at least one entrance hole of the plurality of entrance holes, wherein an opening of the side hole passes through a sidewall of the entrance hole; and
     a plurality of exit holes, having a second diameter smaller than the first diameter, recessed into a downstream side of the gas nozzle and physically joined to an entrance hole, wherein each of the plurality of exit holes has the second diameter, wherein the plurality of exit holes are arranged into a plurality of subsets, and each subset of exit holes is joined to one of the plurality of entrance holes, wherein each of the exit holes in the subset is dimensioned so that the subset of exit holes occupies an area on the downstream side of the gas nozzle that is no greater than an area the joined entrance hole occupies on the upstream side of the gas nozzle, and wherein the second diameter is between 250 μm and 800 μm, and wherein a minimum wall thickness between each of the plurality of exit holes in a subset is between 380 μm and 7,500 μm; and
   an RF source to generate a plasma of the process gas.

7. The plasma etch system of claim 6, wherein the second diameter is between 250 μm and 500 μm.

8. The plasma etch system of claim 6, wherein the exit hole is disposed with the chamber directly over a chuck surface which supports a workpiece during operation of the plasma etch system, and wherein the downstream side of the gas nozzle is substantially parallel with the chuck surface.

9. The plasma etch system of claim 6, wherein the gas nozzle is coupled to a source of $SiCl_4$.

* * * * *